Figures 1, 2:
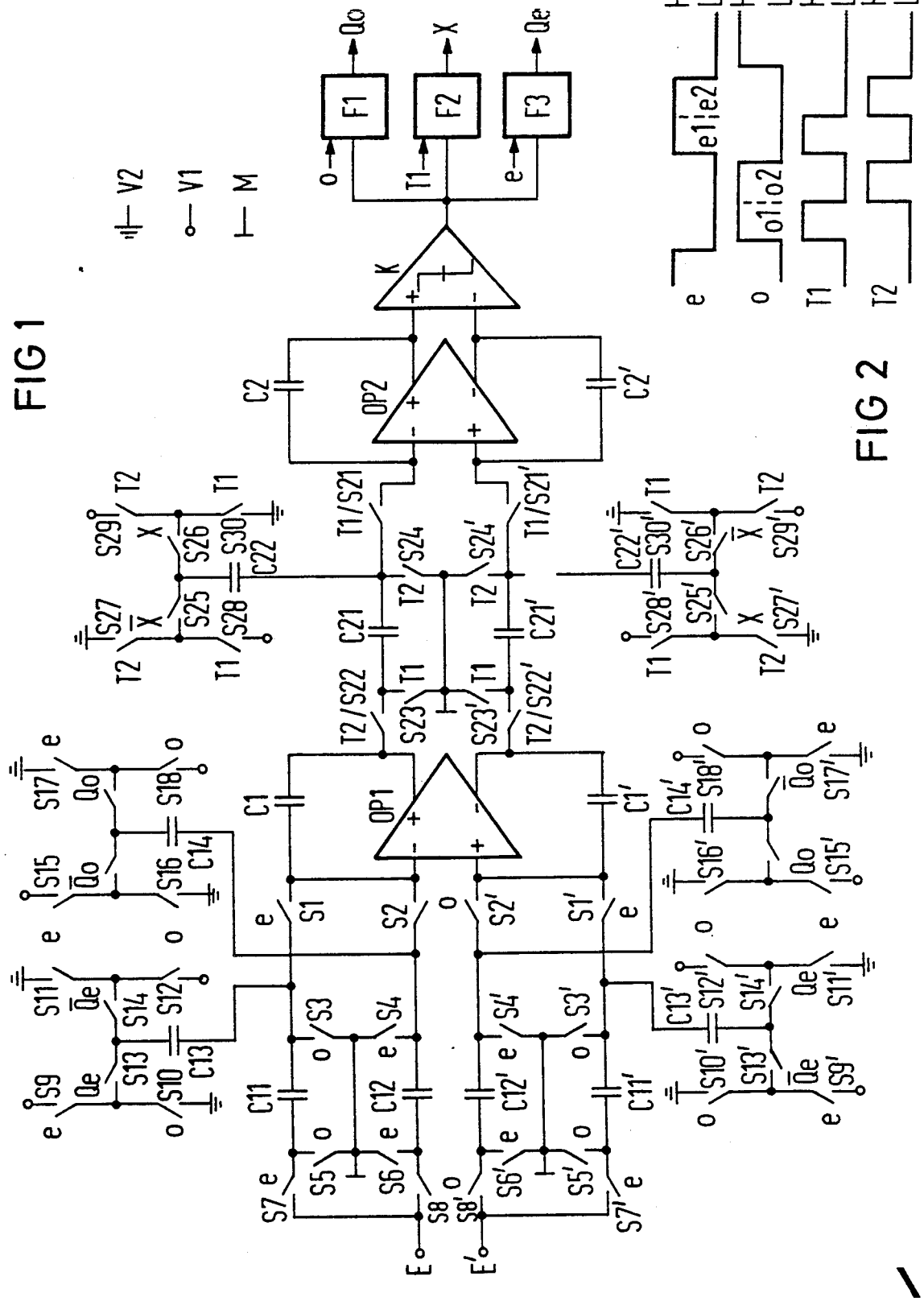

United States Patent [19]
Koch

[11] Patent Number: 5,057,839
[45] Date of Patent: Oct. 15, 1991

[54] INTEGRATABLE SWITCHED-CAPACITOR SIGMA-DELTA MODULATOR

[75] Inventor: Rudolf Koch, Unterhaching, Fed. Rep. of Germany

[73] Assignee: Siemens Aktiengesellschaft, Munich, Fed. Rep. of Germany

[21] Appl. No.: 520,521

[22] Filed: May 7, 1990

[30] Foreign Application Priority Data

May 8, 1989 [EP] European Pat. Off. ........ 89108256.2

[51] Int. Cl.⁵ .................................. H03M 3/02
[52] U.S. Cl. .................................. 341/143; 341/172; 375/122
[58] Field of Search ........................ 341/143, 166, 172; 375/122

[56] References Cited

U.S. PATENT DOCUMENTS

| | | | |
|---|---|---|---|
| 4,232,302 | 11/1980 | Jabatich | 341/138 |
| 4,622,536 | 11/1986 | Shih et al. | 341/108 |
| 4,633,223 | 12/1986 | Senderowicz | 341/118 |
| 4,677,422 | 6/1987 | Naito | 341/122 |
| 4,706,066 | 11/1987 | Dijkmans | 341/172 |
| 4,918,454 | 4/1990 | Early et al. | 341/172 |
| 4,939,516 | 7/1990 | Early | 341/143 |
| 4,972,436 | 11/1990 | Halim et al. | 375/28 |
| 4,999,634 | 3/1991 | Brazdrum et al. | 341/172 |
| 5,001,725 | 3/1991 | Senderowicz et al. | 341/143 |

OTHER PUBLICATIONS

Proceedings of the IEEE 1988 Customs Integrated Circuits Conference, Rochester, N.Y., May 16–19, 1988, pp. 21.3.1–21.3.4, IEEE, New York, U.S.; S. R. Norsworthy et al.: "A 13-Bit, 160 kHz sigma-delta A/D Converter for ISDN".

Patent Abstracts of Japan, Vol. 9, No. 150 (E-324) (1873), Jun. 25, 1985; & JP-A-60 31 315 (Nippon Denki K.K.), Feb. 2, 1985.

Electronics Letters, Feb. 17, 1983, vol. 19, No. 4, G. Lainey et al.: "Switched-Capacitor Second-Order Noise-Shaping Coder", pp. 149–150.

*Primary Examiner*—A. D. Pellinen
*Assistant Examiner*—Marc S. Hoff
*Attorney, Agent, or Firm*—Herbert L. Lerner; Laurence A. Greenberg

[57] ABSTRACT

A switched-capacitor sigma-delta modulator includes at least one memory element, at least one comparator connected to the at least one memory element, and at least one integrator connected to the at least one comparator. The at least one integrator has a first input stage including a series circuit of a first switch, a first capacitor with two terminals and a second switch, a third switch for connecting one of the two terminals of the first capacitor to ground potential, and a fourth switch for connecting the other of the two terminals of the first capacitor to ground potential. The at least one integrator also has a second input stage connected parallel ot the first input stage including a series circuit of a fifth switch, a second capacitor having two terminals and a sixth switch, a seventh switch for connecting one of the two terminals of the second capacitor to ground potential, and an eighth switch for connecting the other of the two terminals of the second capacitor to ground potential. Only one integrator with high amplication which is disposed in an outer feedback loop of the sigma-delta modulator, may have the second input stage. The first and second capacitors and the switches of the first and second input stages may be substantially identically set up and the switches have various switching phases.

3 Claims, 1 Drawing Sheet

INTEGRATABLE SWITCHED-CAPACITOR SIGMA-DELTA MODULATOR

The invention relates to an integratable switched-capacitor sigma-delta modulator having at least one memory element, at least one comparator and at least one integrator with an input stage having a series circuit of a first switch, a first capacitor and a second switch, and third and fourth switches through which the two terminals of the first capacitor can be respectively acted upon by ground potential.

At present, high-resolution, highly linear analog/digital converters with a resistor, transistor or capacitor network are achievable only with some form of calibration or correction. For some applications, analog/digital converters with oversampling and noise filtering represent a practicable solution. Work is carried out with a high sampling frequency rather than high resolution, and in a following digital, i.e., uncritical filter, a low-frequency, high-resolution signal is obtained from the high-frequency signal with low resolution.

An analog/digital converter of that kind is provided, for instance, by means of a second order sigma-delta modulator followed by a filter. A simplified description of such a converter type can be made if a comparator (that is, a one-bit analog/ digital converter) is considered as a linear element with a transmission function of $H=1$, and an additional uncorrelated quantification noise N is introduced as a disturbance variable. For the output signal of the converter, the result is that the input signal is transmitted linearly, and the noise undergoes high-pass filtering. A typical second order sigma-delta modulator has two integrators (therefore the second order), for example, two digital/analog converters and one comparator. The first integrator is acted upon by the sum of the input signal of the sigma delta modulator and the output signal of the first digital/analog converter, while the sum of the output signal of the first integrator and the output signal of the second digital/analog converter is applied to the input of the second integrator. The output signal of the second integrator is delivered to the comparator. The output of the comparator triggers the two digital/analog converters directly or through memory elements.

However, the insensitivity to parameter fluctuations can be even further increased if the sigma-delta modulator is made by switched-capacitor technology instead of with RC elements, for determining the time constants, for example the integrator time constants. In that case, the time constants are no longer determined by the absolute magnitude of a resistor R and a capacitor C, but instead by the ratio of two capacitors, which is subject to substantially less fluctuation. The construction of a switched-capacitor sigma-delta modulator is known, for instance, from G. Lainey et al, "Switched-Capacitor Second Order Noise Shaping Coder", Electronics Letters, Feb. 1983, Vol. 19, No. 4, pp. 149–150.

Sigma-delta modulators basically operate by oversampling, in other words at a high clock frequency. The bandwidth of the integrators or the operational amplifiers being used is in turn above the clock frequency by a certain factor, in order to assure adequately accurate transient response of the integrators or operational amplifiers during each clock period. To that end, the bandwidth of the integrators or operational amplifiers must be located considerably above the highest frequency to be processed. The attainable bandwidth of the operational amplifiers is therefore often the limit for feasibility of an oversampling switched-capacitor analog/digital converter.

It is accordingly an object of the invention to provide an integratable switched-capacitor sigma-delta modulator, which overcomes the hereinafore-mentioned disadvantages of the heretofore-known devices of this general type and in which lesser requirements in terms of the bandwidth can be made of the integrators or operational amplifiers.

With the foregoing and other objects in view there is provided, in accordance with the invention, a switched-capacitor sigma-delta modulator, comprising at least one memory element; at least one comparator connected to the at least one memory element; and at least one integrator connected to the at least one comparator; the at least one integrator having a first input stage including a series circuit of a first switch, a first capacitor with two terminals and a second switch, a third switch for connecting one of the two terminals of the first capacitor to ground potential, and a fourth switch for connecting the other of the two terminals of the first capacitor to ground potential; and the at least one integrator having a second input stage connected parallel to the first input stage in the case of at least one integrator, including a series circuit of a fifth switch, a second capacitor having two terminals and a sixth switch, a seventh switch for connecting one of the two terminals of the second capacitor to ground potential, and an eighth switch for connecting the other of the two terminals of the second capacitor to ground potential.

In accordance with another feature of the invention, the at least one integrator with the second input stage is in the form of one integrator having high amplification and being disposed in an outer feedback loop of the sigma-delta modulator, and there is provided at least one other integrator without a second input stage.

In accordance with a further feature of the invention, the first and second capacitors and the switches of the first and second input stages are substantially identically set up.

In accordance with a concomitant feature of the invention, the first and second switches have switching phases opposed to the third and fourth switches, the fifth and sixth switches have switching phases equivalent to the switching phases of the third and fourth switches, and the seventh and eighth switches have switching phases equivalent to the switching phases of the first and second switches.

An advantage of the invention is that the effective clock frequency occurring at the operational amplifier is divided in half, and therefore either the bandwidth of the integrator-operational amplifier is reduced by half, or the clock frequency overall can be doubled, so that the resolution can be increased.

Other features which are considered as characteristic for the invention are set forth in the appended claims.

Although the invention is illustrated and described herein as embodied in an integratable switched-capacitor sigma-delta modulator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic and block circuit diagram of a version of a switched-capacitor sigma-delta modulator according to the invention; and FIG. 2 is a graph showing the course of the switching phases in the device of FIG. 1.

Referring now to the figures of the drawing in detail and first, particularly, to the exemplary embodiment shown in FIG. 1 thereof, there are seen two operational amplifiers OP1, OP2. A capacitor C1 is connected between the non-inverting output and the inverting input, and a capacitor C1' is connected between the inverting output and the non-inverting input of the first operational amplifier OP1. The non-inverting input of the first operational amplifier OP1 is connected to an input E, firstly through a switch S1, a capacitor C11 and a switch S7, and secondly through a switch S2, a capacitor C12 and a switch S8. Moreover, the terminal of the capacitor C11 oriented toward the input E can be connected to a ground potential, which is given reference symbol M as seen in the legend, through a switch S5, and the terminal thereof oriented away from the input E can be connected to the ground potential through a switch S3. The terminal of the capacitor C12 oriented toward the input E can be connected to the ground potential through a switch S6, and the terminal thereof oriented away from the input E can be connected to the ground potential through a switch S4. A capacitor C13 is connected to a nodal point formed by the capacitor C11, the switch S3 and the switch S1. The other terminal of the capacitor C13 is acted upon by two switches S13 and S14. Following the switch S13 is a switch S9 leading to a potential V1, and a switch S10 leading to a potential V2, as indicated by the legend. Likewise, the switch S14 is followed by a switch S11 leading to the potential V2 and a switch S12 leading to the potential V1. A capacitor C14 is connected to a nodal point formed by the capacitor C12, the switch S4 and the switch S2. The other terminal of the capacitor C14 is acted upon by two switches S19 and S20. The switch S19 is followed by a switch S15 leading to the potential V1 and a switch S16 leading to the potential V2. Likewise, the switch S20 is followed by a switch S17 leading to the potential V2 and a switch S18 leading to the potential V1.

The wiring between the non-inverting input of the operational amplifier OP1 and an input E' is constructed in the same manner as the wiring between the inverting input of the operational amplifier OP1 and the input E. The non-inverting input of the first operational amplifier OP1 is connected to the input E' firstly through a switch S1', a capacitor C11' and a switch S7', and secondly through a switch S2', a capacitor C12' and a switch S8'. Moreover, the terminal of the capacitor C11' oriented toward the input E' can be connected to the ground potential M through a switch S5', and the terminal thereof oriented away from the input E' can be connected to the ground potential through a switch S3'. The terminal of the capacitor C12' oriented toward the input E' can be connected to the ground potential through a switch S6', and the terminal thereof oriented away from the input E' can be connected to the ground potential through a switch S4'. A capacitor C13' is connected to a nodal point formed by the capacitor C11', the switch S3' and the switch S1'. The other terminal of the capacitor C13' is acted upon by two switches S13' and S14'. The switch S13' is again followed by a switch S9' leading to a potential V1 and by a switch S10' leading to the potential V2. Likewise, the switch S14' is followed by a switch S11' leading to the potential V2 and by a switch S12' leading to the potential V1. A capacitor C14' is connected to a nodal point formed by the capacitor C12', the switch S4' and the switch S2'. The other terminal of the capacitor C14' is acted upon by two switches S19' and S20'. The switch S19' is followed by a switch S15' leading to the potential V1 and a switch S16' leading to the potential V2. Likewise, the switch S20' is followed by a switch S17' leading to the potential V2' and a switch S18' leading to the potential V1.

A capacitor C2 is connected between the non-inverting output and the inverting input, and a capacitor C2' is connected between the inverting output and the non-inverting input of the second operational amplifier OP2. The non-inverting output of the first operational amplifier OP1 is connected through a switch S22, a capacitor C21 and a switch S21 to the inverting input of the second operational amplifier OP2. In the same manner, the inverting output of the first operational amplifier OP1 is connected through a switch S22', a capacitor C21' and a switch S21' to the non-inverting input of the second operational amplifier OP2. Moreover, the terminals of the two capacitors C21 and C21' oriented toward the first operational amplifier OP1 are connected through respective switches S23 and S23' to the ground potential M, and the terminals thereof oriented toward the second operational amplifier OP2 are each connected to the ground potential M through a respective switch S24 and S24'. One terminal of a capacitor C22 is connected to a nodal point formed by the capacitor C21, the switch S24 and the switch S21, while the other terminal thereof is acted upon by two switches S25 and S26. The switch S25 is connected firstly to a switch S27 leading to the potential V2, and secondly to a switch S28 leading to the potential V1. The switch S26 is connected to a switch S29 leading to the potential V1 and to a switch S30 leading to the potential V2. Correspondingly, one terminal of a capacitor C22' is connected to a nodal point formed by the capacitor C21', the switch S24' and the switch S21', while the other terminal thereof is acted upon by two switches S25' and S26'. The switch S25' is connected firstly to a switch S27' leading to the potential V2, and secondly to a switch S28' leading to the potential V1. The switch S26' is connected to a switch S29' leading to the potential V1 and to a switch S30' leading to the potential V2.

The non-inverting output of the second operational amplifier OP2 is coupled with the non-inverting input of a comparator K, and the inverting output of the operational amplifier OP2 is coupled to the inverting input of the comparator K. The output of the comparator K is carried to the inputs of three flip-flops F1–F3 as memory cells. A signal Qo is present at the output of the flip-flop F1; a signal x is present at the output of the flip-flop F2; and a signal Qe is present at the output of flip-flop F3.

The switching cycles of the switches S1, S1' through S30, S30' and of the flip-flops F1–F3 are oriented to the fundamental behavior of two switching phases e and o. The chronological relationship of the two phases is shown in FIG. 2 of the drawing. First, phase e is at a high level H and phase o is at a low level L. After a signal change in phase e, and after a brief delay, a signal change of phase o from the low level L to the high level H takes place. For a given period of time, phase o then carries the signal H. This period is divided into two ranges o1 and o2. After the signal transition from H to L in phase o, and after a brief delay, a signal change from L to H takes place in phase e. Phase e then carries the signal H for a given period of time, which is divided into two zones e1 and e2. According to this diagram, the generation of signals of phase e and phase o takes place continuously. Two signals T1 and T2 are then derived therefrom. The signal T1 carries the level H whenever the phase zone or range e1 or o1 appears, and the signal T2 carries the level H whenever the phase zone or range e2 or o2 appears. The various switches are then each triggered by different signals. The switches S1, S1', S7, S7', S6, S6', S4, S4', S9, S9', S11, S11', S15, S15', S17, S17', and the flip-flop F3, are controlled by the signal e. The switches S3, S3', S5, S5', S8, S8', S2, S2', S10, S10', S12, S12', S16, S16', S18, S18', and the flip-flop F1, are controlled by the signal o. The switching cycles of the switches S28, S28', S30, S30', S21, S21' and of the flip-flop F2 are defined by the signal T1. The switching cycles of the switches S27, S27', S29, S29', S22, S22', S24, S24' are defined by the signal T2. Furthermore, the switches S19 and S20' are triggered with an inverted signal Qo and the switches S20 and S19' are triggered with a non-inverted signal Qo. The switches S14 and S13' are triggered with an inverted signal Qe, and the switches S13 and S14' are triggered with a non-inverted signal Qe. The triggering of the switches S25 and S26' is effected by an inverted signal x, and the triggering of the switches S26 and S25' is effected with a non-inverted signal x. The layout of the sigma-delta modulator shown in the drawing is completely symmetrical in terms of the inverting and non-inverting inputs of the two operational amplifiers OP1 and OP2, except for the three flip-flops F1–F3 and the comparator K.

A conventional layout of an integrator is provided in the present exemplary embodiment, based on the operational amplifier OP1 in combination with the capacitor C1, by means of a first input stage having a first capacitor C12 and first through fourth switches S2, S8, S4 and S6, respectively. However, in accordance with the invention, the first input stage has a second input stage being formed of a second capacitor C11 and fifth through eighth switches S1, S7, S3 and S5, respectively, connected parallel thereto. Both stages are essentially laid out identically, embodying the invention, so as to advantageously attain good common mode behavior. Only the triggering of the two stages is effected in phase opposition, as can be seen from FIG. 1 in combination with FIG. 2. This exploits the fact that in the integrator shown, the operational amplifier OP1 is active only during one-half of a switching phase, and during the other half switching phase merely keeps the output level constant. Due to the parallel connection of two identical input stages that are clocked in phase opposition, the operational amplifier OP1 is active during each clock phase. However, this parallel connection of two input stages is equivalent to a doubling of the sampling rate, so that the clock rate for the integrator can be divided in half, and twice the time is then available for transient response for the operational amplifier OP1.

Alternatively, with the same rise time, the clock rate can be doubled.

The basic principle described above can also be applied to the second integrator having the second operational amplifier OP2 in the circuit shown. However, this is not the case in the present exemplary embodiment. In fact, the maximum demand within the circuit is made of the first integrator. Less than ideal properties of the second integrator and of the comparator are attenuated in their effects by the amplification of the preceding stage or stages. According to a feature of the invention, an integrator wired in accordance with the invention and having amplification is therefore provided as the first integrator. This considerably reduces the demands made of the second integrator. In addition to use as second order sigma-delta modulators, use with other order modulators is likewise advantageous.

In closing, it is noted that besides the differential embodiment shown, an asymmetrical layout is also possible. Then the stages each connected to the non-inverting inputs of the operational amplifier are disconnected, for instance, and the non-inverting inputs of the operational amplifiers OP1, OP2 and the inverting input of the comparator K are applied to ground potential M.

I claim:

1. Switched-capacitor sigma-delta modulator, comprising at least one memory element; at least one comparator connected to said at least one memory element; and at least one integrator connected to said at least one comparator; said at least one integrator having a first input stage including a series circuit of a first switch, a first capacitor with two terminals and a second switch, a third switch for connecting one of the two terminals of said first capacitor to ground potential, and a fourth switch for connecting the other of the two terminals of said first capacitor to ground potential; and said at least one integrator having a second input stage connected parallel to said first input stage including a series circuit of a first switch, a second capacitor having two terminals and a sixth switch, a seventh switch for connecting one of the two terminals of said second capacitor to ground potential, and an eighth switch for connecting the other of the two terminals of said second capacitor to ground potential, said first and second switches having switching phases opposed to said third and fourth switches, said fifth and sixth switches having switching phases equivalent to the switching phases of said third and fourth switches, and said seventh and eighth switches having switching phases equivalent to the switching phases of said first and second switches.

2. Sigma-delta modulator according to claim 1, wherein said at least one integrator with said second input stage is in the form of one integrator having high amplification and being disposed in an outer feedback loop of the sigma-delta modulator, and including at least one other integrator without a second input stage.

3. Sigma-delta modulator according to claim 1, wherein said first and second capacitors and said switches of said first and second input stages are substantially identically set up.

* * * * *